(12) United States Patent
Hwang et al.

(10) Patent No.: US 11,830,813 B2
(45) Date of Patent: Nov. 28, 2023

(54) SEMICONDUCTOR DEVICES INCLUDING POWER CONNECTION LINES

(71) Applicant: Samsung Electronics Co., Ltd., Suwon-si (KR)

(72) Inventors: Jisoo Hwang, Hwaseong-si (KR); Chunguan Kim, Yongin-si (KR); Heeseok Lee, Suwon-si (KR); Kyoungkuk Chae, Suwon-si (KR)

(73) Assignee: Samsung Electronics Co., Ltd, Gyeonggi-do (KR)

( * ) Notice: Subject to any disclaimer, the term of this patent is extended or adjusted under 35 U.S.C. 154(b) by 86 days.

(21) Appl. No.: 17/374,143

(22) Filed: Jul. 13, 2021

(65) Prior Publication Data

US 2022/0045004 A1 Feb. 10, 2022

(30) Foreign Application Priority Data

Aug. 7, 2020 (KR) .................... 10-2020-0099244

(51) Int. Cl.
*H01L 23/528* (2006.01)
*H01L 23/00* (2006.01)
(Continued)

(52) U.S. Cl.
CPC .... *H01L 23/5286* (2013.01); *H01L 23/49816* (2013.01); *H01L 23/49822* (2013.01); *H01L 23/49833* (2013.01); *H01L 23/49838* (2013.01); *H01L 23/5221* (2013.01); *H01L 23/5385* (2013.01); *H01L 23/5386* (2013.01); *H01L 24/16* (2013.01); *H01L 24/17* (2013.01); *H01L 25/0655* (2013.01); *H01L 2224/16235* (2013.01); *H01L 2224/17134* (2013.01);
(Continued)

(58) Field of Classification Search
None
See application file for complete search history.

(56) References Cited

U.S. PATENT DOCUMENTS

| 8,946,868 B2 | 2/2015 | Leung et al. |
| 9,448,940 B2 | 9/2016 | Shalf et al. |

(Continued)

FOREIGN PATENT DOCUMENTS

JP 2009-289796 A 12/2009

OTHER PUBLICATIONS

Jisoo Hwang et al., "Co-optimization of PDN Design for Tri-cluster Multiple CPU Cores of SOC with various decoupling capacitors integrated in Small Form-Factor Package" 2020, IEEE, 70th Electronic Components and Technology Conference.

*Primary Examiner* — Long Pham
(74) *Attorney, Agent, or Firm* — Harness, Dickey & Pierce, P.L.C.

(57) ABSTRACT

A semiconductor chip includes a first core region including a first core and a first power line configured to provide a first voltage to the first core, a second core region including a second core and a second power line configured to provide the first voltage to the second core, a cache region between the first core region and the second core region, the cache region including a cache and a third power line providing a second voltage to the cache, and arranged between the first core region and the second core region; and a first power connection line connecting the first power line to the second power line and arranged in the cache region.

20 Claims, 13 Drawing Sheets

(51) Int. Cl.
*H01L 23/498* (2006.01)
*H01L 23/538* (2006.01)
*H01L 23/522* (2006.01)
*H01L 25/065* (2023.01)

(52) U.S. Cl.
CPC ............... *H01L 2924/1427* (2013.01); *H01L 2924/1432* (2013.01)

(56) References Cited

U.S. PATENT DOCUMENTS

| | | |
|---|---|---|
| 9,547,034 B2 | 1/2017 | Camarota |
| 10,019,048 B2 | 7/2018 | Chen |
| 10,490,503 B2 * | 11/2019 | Collins ............... H01L 23/5384 |
| 2017/0125380 A1 | 5/2017 | Han |
| 2021/0165436 A1 * | 6/2021 | Trimberger ............. G05F 1/575 |

* cited by examiner

SEMICONDUCTOR DEVICES INCLUDING POWER CONNECTION LINES

CROSS-REFERENCE TO RELATED APPLICATION

This application is based on and claims priority under 35 U.S.C. § 119 to Korean Patent Application No 10-2020-0099244, filed on Aug. 7, 2020, in the Korean Intellectual Property Office, the disclosure of which is incorporated by reference herein in its entirety.

BACKGROUND

The inventive concepts relate to semiconductor devices, and more particularly, to semiconductor devices including one or more power connection lines.

A semiconductor device may include a plurality of semiconductor regions formed on one die. The plurality of semiconductor regions may be spaced apart from each other to improve heat characteristics. Each of the plurality of semiconductor regions may include a power line. As a semiconductor device is integrated, regions of the plurality of semiconductor regions using the same operating voltage may be managed as one power domain.

SUMMARY

The inventive concepts provide semiconductor devices including one or more power connection lines for connecting power lines that are spaced apart from each other, and providing improved power integrity.

According to some example embodiments of the inventive concepts, a semiconductor chip may include a first core region including a first core and a first power line configured to provide a first voltage to the first core, a second core region including a second core and a second power line configured to provide the first voltage to the second core, a cache region between the first core region and the second core region, and a first power connection line in the cache region. The cache region may include a cache and a third power line configured to provide a second voltage to the cache. The first power connection line may connect the first power line to the second power line.

According to some example embodiments of the inventive concepts, a semiconductor device may include a semiconductor chip including a first semiconductor region including a first power grid configured to be provided with a first voltage and a second semiconductor region including a second power grid configured to be provided with the first voltage. The semiconductor device may include a package substrate including a first power plane configured to transmit the first voltage to the first power grid and the second power grid and connected to the semiconductor chip in a vertical direction. The semiconductor chip may include a power connection line between the first semiconductor region and the second semiconductor region and connecting the first power grid to the second power grid.

According to some example embodiments of the inventive concepts, a semiconductor system may include a semiconductor chip including a first semiconductor region including a first power line, and a second semiconductor region including a second power line. The semiconductor system may include a package substrate including a first power plane configured to transmit a first operating voltage to the first power line and the second power line, and a power management integrated circuit including a first voltage regulator module that is configured to generate the first operating voltage from an external power source and configured to transmit the first operating voltage to the first power plane. The semiconductor chip may include a first power connection line between the first semiconductor region and the second semiconductor region and connecting the first power line to the second power line.

BRIEF DESCRIPTION OF THE DRAWINGS

Example embodiments of the inventive concepts will be more clearly understood from the following detailed description taken in conjunction with the accompanying drawings in which.

DETAILED DESCRIPTION

Figure 1:
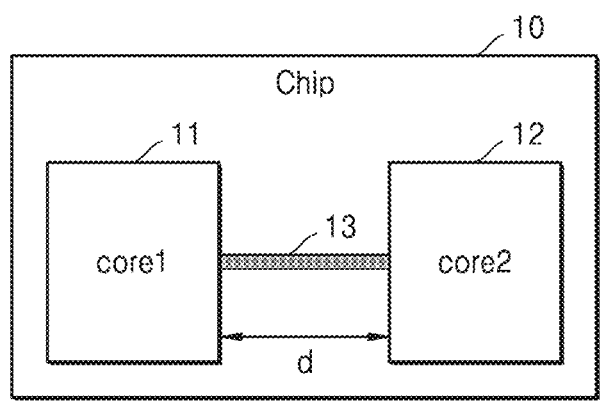
FIG. 1 is a block diagram illustrating a processor chip including a power connection line according to some example embodiments.

Hereinafter, various example embodiments will be described with reference to the accompanying drawings.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present such that the element and the other element are isolated from direct contact with each other by one or more interposing spaces and/or structures. In contrast, when an element is referred to as being "directly on" another element, there are no intervening elements present such that the element and the other element are in direct contact with each other. As described herein, an element that is "on" another element may be above, beneath, and/or horizontally adjacent to the other element.

It will be understood that elements and/or properties thereof may be recited herein as being "the same" or "equal" as other elements, and it will be further understood that elements and/or properties thereof recited herein as being "the same" as or "equal" to other elements may be "the same" as or "equal" to or "substantially the same" as or "substantially equal" to the other elements and/or properties thereof. Elements and/or properties thereof that are "substantially the same" as or "substantially equal" to other elements and/or properties thereof will be understood to include elements and/or properties thereof that are the same as or equal to the other elements and/or properties thereof within manufacturing tolerances and/or material tolerances. Elements and/or properties thereof that are the same or substantially the same as other elements and/or properties thereof may be structurally the same or substantially the same, functionally the same or substantially the same, and/or compositionally the same or substantially the same.

It will be understood that elements and/or properties thereof described herein as being the "substantially" the same encompasses elements and/or properties thereof that have a relative difference in magnitude that is equal to or less than 10%. Further, regardless of whether elements and/or properties thereof are modified as "substantially," it will be understood that these elements and/or properties thereof should be construed as including a manufacturing or operational tolerance (e.g., ±10%) around the stated elements and/or properties thereof.

When the terms "about" or "substantially" are used in this specification in connection with a numerical value, it is intended that the associated numerical value include a tolerance of ±10% around the stated numerical value. When ranges are specified, the range includes all values therebetween such as increments of 0.1%.

FIG. 1 is a block diagram illustrating a processor chip including a power connection line according to some example embodiments. Referring to FIG. 1, a processor chip 10 may include a plurality of cores including, for example, a first core 11 and a second core 12. The processor chip 10 may be a multicore processor chip. A core may be a processing unit for independently reading and executing a program instruction. The plurality of cores including, for example, the first core 11 and the second core 12 may be formed on one die. When the plurality of cores including, for example, the first core 11 and the second core 12, read and execute a program instruction, heat may be generated. When the plurality of cores including, for example, the first core 11 and the second core 12, are adjacent to each other, the overall heat of the processor chip 10 may be excessively high due to the interaction of heat generated from each of the plurality of cores including, for example, the first core 11 and the second core 12. The plurality of cores including, for example, the first core 11 and second core 12 may be spaced apart from each other by a reference distance d to reduce heat generation.

As IP blocks included in the processor chip 10 increase, IP blocks using the same operating voltage may be managed as the same power domain. The plurality of cores including, for example, the first core 11 and the second core 12 may be included in a power domain provided with a first operating voltage. As illustrated in FIG. 1, when the plurality of cores including, for example, the first core 11 and the second core 12 are spaced apart from each other, a power delivery network (PDN) indicating a power supply route connected from an external power source to a core may be separated for each of the plurality of cores including, for example, the first core 11 and the second core 12. In other words, the same operating voltage may be provided to each of the plurality of cores including, for example, the first core 11 and the second core 12 through the separated power delivery network, and thus, an operating voltage may not be stably supplied to the plurality of cores including, for example, the first core 11 and the second core 12. Therefore, the processor chip 10 according to some example embodiments may include a power connection line 13 for connecting a first power line (not shown) for providing an operating voltage to the first core 11 to a second power line (not shown) for providing an operating voltage to the second core 12. A power line (not shown) may be a conductive metal for supplying power to transistors included in a core. As the power connection line 13 is included in the processor chip 10, the same operating voltage may be stably supplied to the first core 11 and the second core 12.

Figure 2:
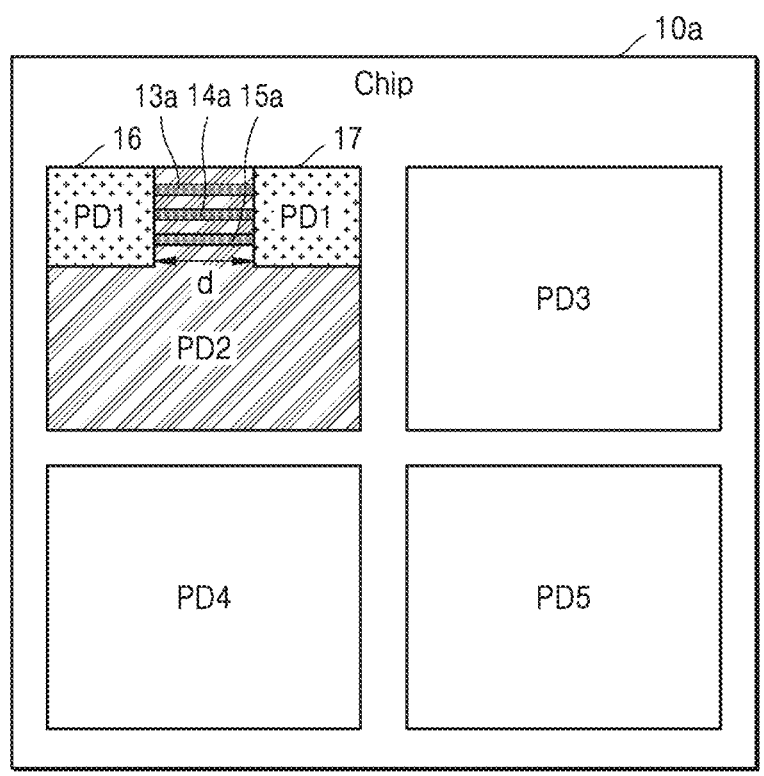
FIG. 2 is a block diagram illustrating a processor chip including a plurality of power domains according to some example embodiments.

FIG. 2 is a block diagram illustrating a processor chip including a plurality of power domains according to some example embodiments. Referring to FIG. 2, a processor chip 10a may include a plurality of power domains including, for example, first, second, third, fourth, and fifth power domains PD1, PD2, PD3, PD4, and PD5. As a processor chip is integrated, IP blocks using various types of operating voltages may be included in one chip. IP blocks using the same operating voltage may be managed as one power domain. In other words, each of the plurality of power domains including, for example, the first through fifth power domains PD1 through PD5 may include IP blocks using the same operating voltage, and each of the plurality of power domains including, for example, the first through fifth power domains PD1 through PD5 may be independently provided with a corresponding operating voltage from the outside. For example, the first power domain PD1 may include a core block, and the second power domain PD2 may include a cache block. The core block may operate by using a first operating voltage (for example, about 0.6 V to about 1.3 V), and the cache block may operate by using a second operating voltage (for example, 1.0 V).

Because each of the plurality of power domains including, for example, the first through fifth power domains PD1 through PD5 is independently provided with an operating voltage from the outside, power lines (not shown) respectively connected to the plurality of power domains including, for example, the first through fifth power domains PD1 through PD5 may be physically separated from each other. As described herein, a power line may be a conductive pattern formed inside a chip and may be configured to transmit, to IP blocks included in a power domain, a voltage transmitted from the outside. As described herein, a power connection line may be a conductive pattern formed inside a chip and may be configured to transmit, to IP blocks included in a power domain, a voltage transmitted from the outside. A conductive pattern may include one or more conductive materials (e.g., copper).

For example, a power line connected to a core and a power line connected to a cache may be physically separated. A power line may refer to a conductive line for providing a voltage to an IP block included in a power domain. However, as described above with reference to FIG. 1, although power domains are included in the same power domain, the power domains may be physically spaced apart from each other to solve the generation of high heat. For example, both a left first power domain 16 and a right first power domain 17 may be included in a first power domain (e.g., first power plane) but may be spaced apart from each other by a reference distance d. The left first power domain 16 may correspond to the first core 11 of FIG. 1, and the right first power domain 17 may correspond to the second core 12 of FIG. 1. As the same power domains are physically spaced apart from each other, power lines connected to the first core 11 and the second core 12 may be physically separated from each other. The processor chip 10a according to some example embodiments may include power connection lines 13a, 14a, and 15a for connecting power lines of cores that are included in the same power domain but are physically spaced apart from each other. Although three power connection lines are illustrated, the number of power connection lines is not limited thereto. As the processor chip 10a includes the power connection lines 13a, 14a, and 15a, the same voltage may be stably supplied to the first core 11 and the second core 12. As will be described later with reference to FIGS. 4 through 7, because on-chip capacitance decreases, power integrity may be improved.

Figure 3:
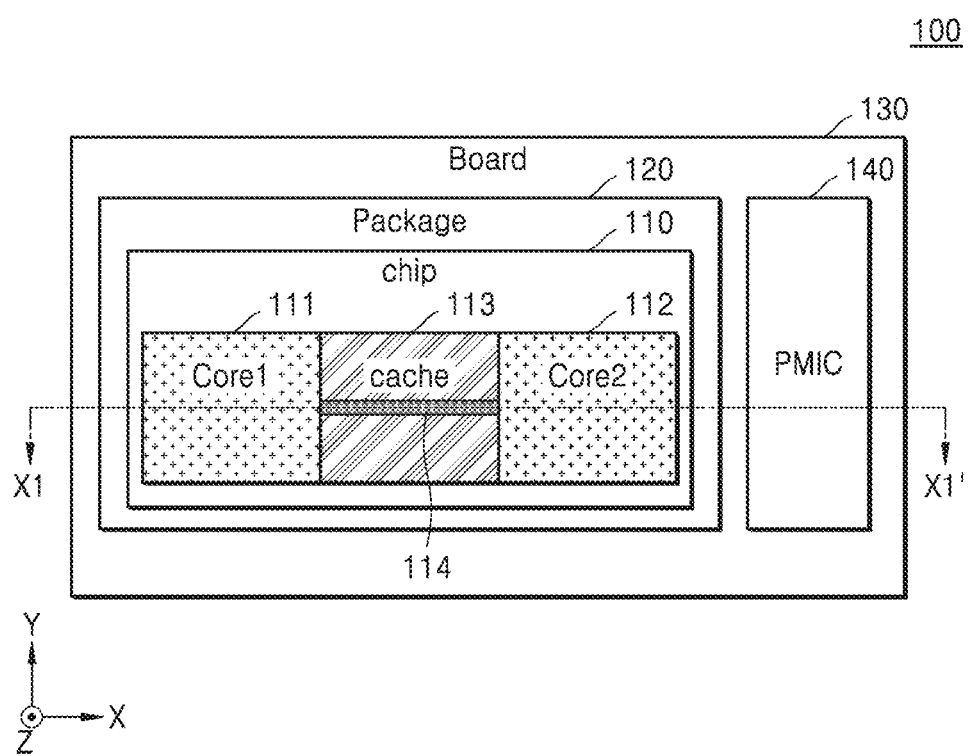
FIG. 3 is a top view illustrating a semiconductor system according to some example embodiments.

FIG. 3 is a top view illustrating a semiconductor system according to some example embodiments. Referring to FIG. 3, a semiconductor system 100 may include a processor chip 110 (also referred to herein interchangeably as a semiconductor chip), a package substrate 120, a board 130, and a power management integrated circuit 140. The processor chip 110 may be mounted on the package substrate 120. The package substrate 120 and the processor chip 110 may be electrically connected to each other through a solder bump. The package substrate 120 and the power management integrated circuit 140 may be mounted on the board 130. The board 130 and the package substrate 120 may be electrically connected to each other through a solder ball.

The power management integrated circuit 140 may include a plurality of voltage regulator modules (VRMs). For example, the power management integrated circuit 140 may include a first voltage regulator module and a second voltage regulator module. A voltage regulator module may be a voltage converter for receiving external input power (e.g., 12 V) and converting the external input power into internal power (e.g., 1 V). In other words, the voltage regulator module may be a DC-DC converter. Each voltage regulator module may be a linear regulator, a nonlinear regulator, a switched-capacitor converter, a switched-inductor converter, or a buck converter. Each voltage regulator module may include one or more power metal-oxide-semiconductor field-effect transistor (MOSFET) devices. The plurality of voltage regulator modules may generate voltages having different levels. The voltages having different levels may be provided to different power domains included in the processor chip 110.

The processor chip 110 may include a first core 111, a second core 112, and a cache 113. The first core 111 and the second core 112 may be included in the same power domain. The first core 111 and the second core 112 may be physically spaced apart from each other to reduce heat generation. The first core 111 and the second core 112 may operate by using the same operating voltage, for example, a first operating voltage. The first core 111 and the second core 112 may be provided with a voltage from a conversion by the first voltage regulator module. The cache 113 may be included in a power domain that is different from the power domain of the first core 111 and the second core 112. The cache 113 may operate by using a second operating voltage. The second operating voltage may be different from the first operating voltage. The cache 113 may be provided with a voltage from conversion by the second voltage regulator module. The second voltage regulator module may be different from the first voltage regulator module. The processor chip 110 may include a power connection line 114 for connecting power lines (not shown) of cores that are included in the same power domain but are physically spaced apart from each other. The power connection line 114 may pass through a region in which the cache 113 is arranged. In other words, the power connection line 114 for connecting first power domains may pass through a region in which a second power domain is arranged. As the processor chip 110 includes the power connection line 114 for connecting a power line of the first core 111 to a power line of the second core 112, the voltage from conversion by the first voltage regulator module may be stably supplied to the first core 111 and the second core 112.

Figure 4:
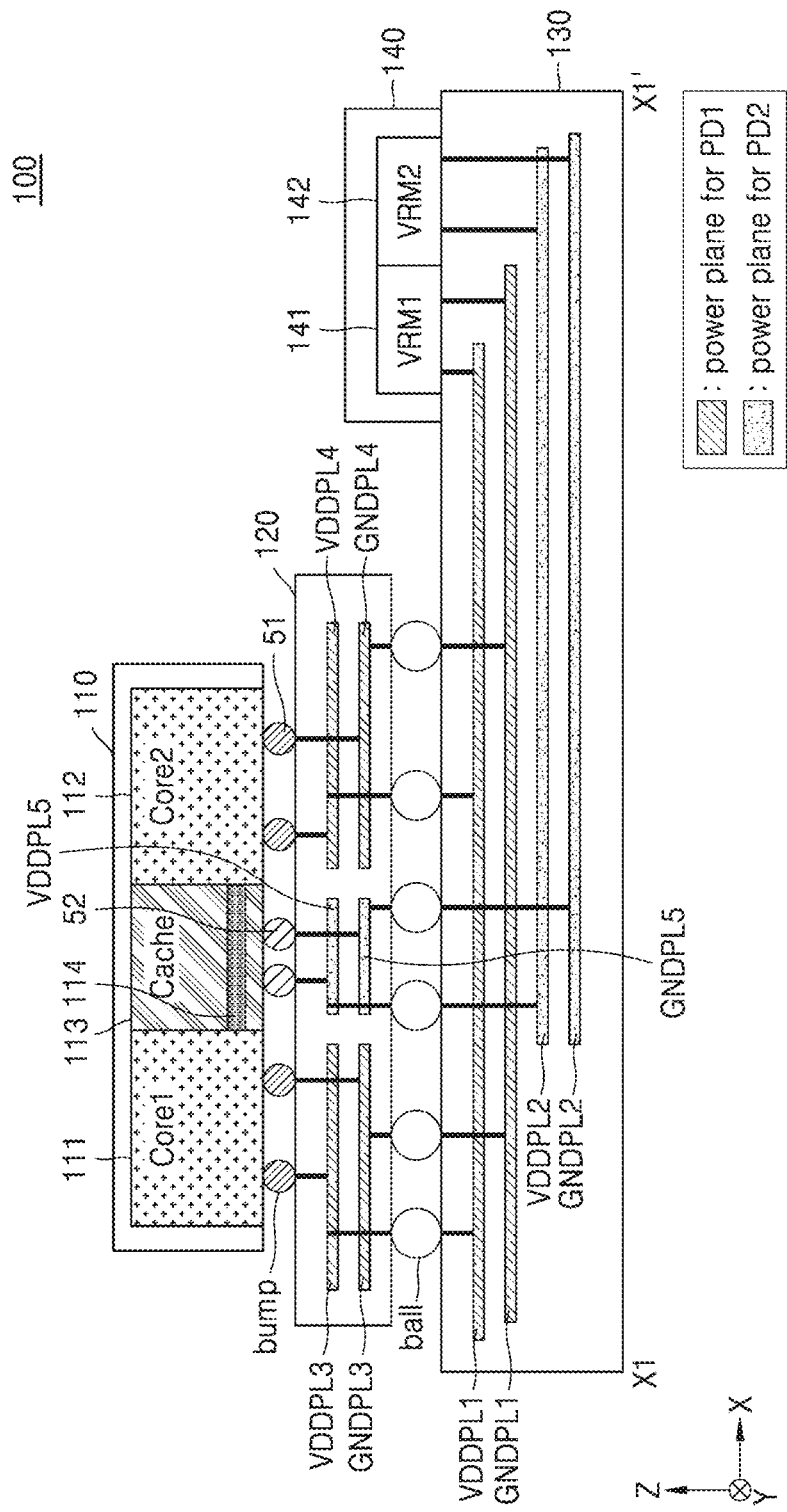
FIG. 4 is a cross-sectional view illustrating a semiconductor system according to some example embodiments.

FIG. 4 is a view illustrating a semiconductor system according to some example embodiments. In detail, FIG. 4 is a cross-sectional view of the semiconductor system 100 taken along line X1-X1' of FIG. 3. The power management integrated circuit 140 may include a first voltage regulator module 141 and a second voltage regulator module 142. The first voltage regulator module 141 may generate a voltage (e.g., first operating voltage) from an external power source and transmit said generated voltage to be provided to a first power domain, i.e., the first core 111 and the second core 112, and the second voltage regulator module 142 may generate a voltage (e.g., second operating voltage) from the external power source and transmit said generated voltage to be provided to a second power domain, i.e., the cache 113. A power domain may mean a block which receives a specific voltage from outside and includes at least one IP block or at least one element included in an IP block. A power domain receives a specific voltage through corresponding power grid or power line. A plurality of power domains may receive corresponding voltages through separated power grid or power line. A plurality of power domains may be included in a processor chip. A specific voltage may be selectively transferred to a corresponding power domain by power switch. At least one IP block or at least one element included in a power domain may receive a specific voltage from a power grid or power line. A power domain may receive a specific voltage from a power plane or ground plane included in an interposer, a package or a board.

The board 130 may include a plurality of power planes including, for example, a first power plane VDDPL1, a second power plane GNDPL1, a third power plane VDDPL2, and a fourth power plane GNDPL2. The first power plane VDDPL1 and the second power plane GNDPL1 may receive, from the first voltage regulator module 141, the voltage to be provided to the first power domain (e.g., first operating voltage) and transmit the voltage to the package substrate 120. The third power plane VDDPL2 and the fourth power plane GNDPL2 may receive, from the second voltage regulator module 142, the voltage to be provided to the second power domain and transmit the voltage to the package substrate 120. For convenience of description, the second power plane GNDPL1 and the fourth power plane GNDPL2 are divided. However, the second power plane GNDPL1 and the fourth power plane GNDPL2 may also be the same power plane. The plurality of power planes including, for example, the first power plane VDDPL1, the second power plane GNDPL1, the third power plane VDDPL2, and the fourth power plane GNDPL2 included in the board 130 may be connected, through solder balls, to a plurality of power planes including, for example, a fifth power plane VDDPL3, a sixth power plane GNDPL3, a seventh power plane VDDPL4, an eighth power plane GNDPL4, a ninth power plane VDDPL5, and a tenth power plane GNDPL5 included in the package substrate 120. A power plane may be a conductive material that transmits a positive supply voltage VDD or a negative supply voltage VSS to the processor chip 110 and is formed on an X-Y plane. Power planes for providing a voltage to a plurality of power domains located within the processor chip 110 may be physically separated.

The package substrate 120 may include the plurality of power planes including, for example, the fifth power plane VDDPL3, the sixth power plane GNDPL3, the seventh power plane VDDPL4, the eighth power plane GNDPL4, the ninth power plane VDDPL5, and the tenth power plane GNDPL5 which are connected to the processor chip 110 in a vertical direction (e.g., Z-axis direction). The fifth and seventh power planes VDDPL3 and VDDPL4 may be connected to the first power plane VDDPL1, and the sixth and eighth power planes GNDPL3 and GNDPL4 may be connected to the second power plane GNDPL1. The fifth and sixth power planes VDDPL3 and GNDPL3 may provide an operating voltage to a power line connected to the first core 111 (e.g., a first power grid), and the seventh and eighth power planes VDDPL4 and GNDPL4 may provide an operating voltage to a power line connected to the second core 112 (e.g., a second power grid). The ninth power plane VDDPL5 may be connected to the third power plane VDDPL2, and the tenth power plane GNDPL5 may be connected to the fourth power plane GNDPL2. The ninth and tenth power planes VDDPL5 and GNDPL5 may provide an operating voltage to a power line connected to the cache 113. The plurality of power planes including, for example, the fifth power plane VDDPL3, the sixth power plane GNDPL3, the seventh power plane VDDPL4, the eighth power plane GNDPL4, the ninth power plane VDDPL5, and the tenth power plane GNDPL5 included in the package substrate 120 may be connected to a power line formed in the processor chip 110 through solder bumps including, for example, a first solder bump 51 and a second solder bump 52. In detail, the fifth and sixth power planes VDDPL3 and GNDPL3 may be connected to the power line connected to the first core 111 through the first solder bump 51, the seventh and eighth power planes VDDPL4 and GNDPL4 may be connected to the power line connected to the second core 112 through the first solder bump 51, and the ninth and tenth power planes VDDPL5 and GNDPL5 may be connected to the power line connected to the cache 113 through the second solder bump 52.

Figure 5:
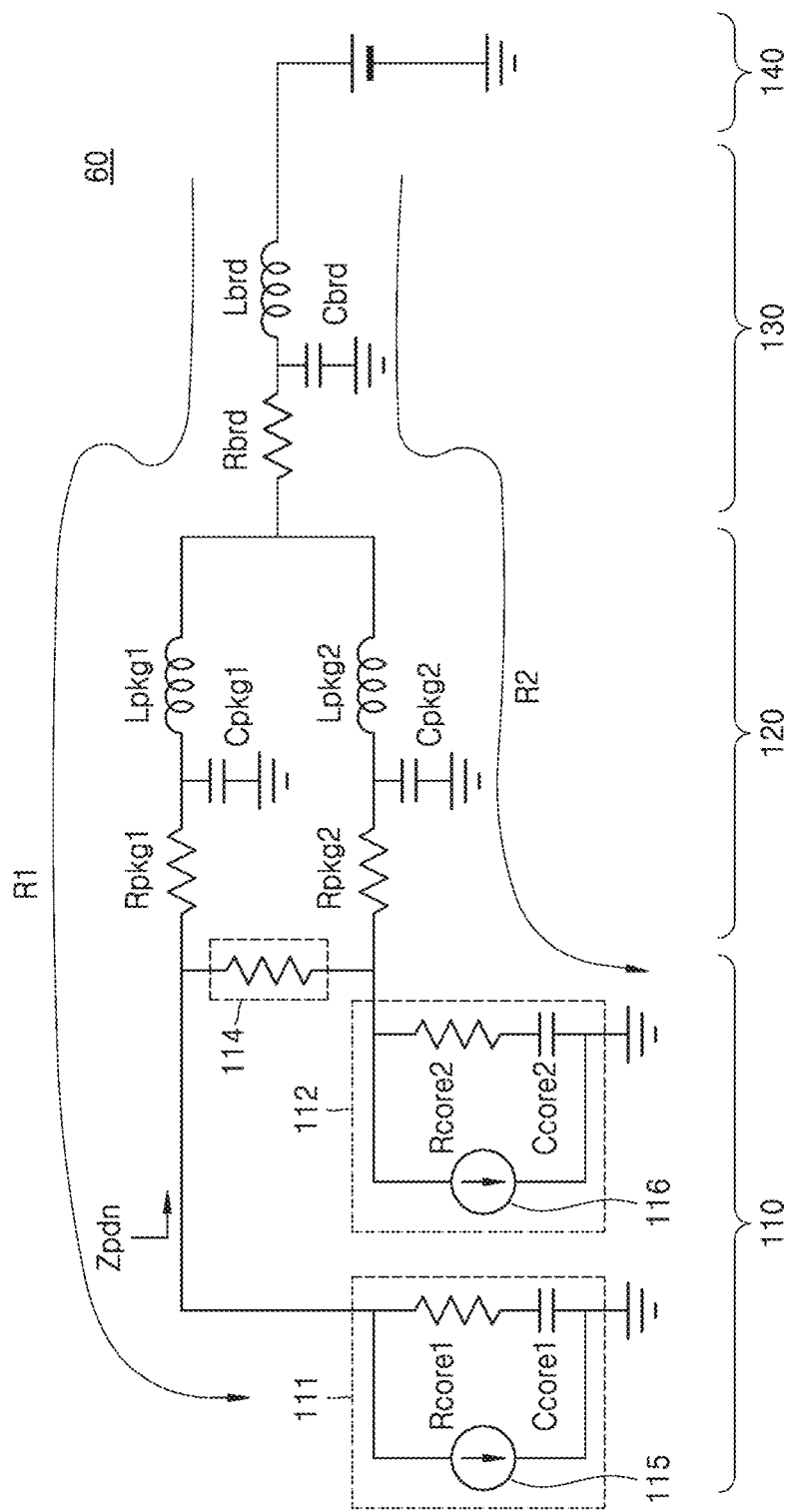
FIG. 5 is a circuit diagram illustrating a power delivery network according to some example embodiments.

FIG. 5 is a view illustrating a power delivery network according to some example embodiments. Referring to FIG. 5, a power delivery network 60 may briefly show a route through which a voltage generated by a power management integrated circuit 140 is transmitted to a board 130, a package substrate 120, and a processor chip 110. In detail, the power delivery network 60 may show a route through which a voltage generated by the first voltage regulator module 141 is transmitted to a first power domain.

In the power delivery network 60, the power management integrated circuit 140 may be understood as a voltage source. The board 130 may be understood as an equivalent circuit expressed by at least one of an inductor (e.g., Lbrd), a capacitor (e.g., Cbrd), and a resistor (e.g., Rbrd).

The package substrate 120 may be expressed as a first route R1 for transmitting a voltage to a first core 111 and a second route R2 for transmitting a voltage to a second core 112. The first route R1 for transmitting the voltage to the first core 111 may be understood as an equivalent circuit including at least one of an inductor (e.g., Lpkg1), a capacitor (e.g., Cpkg1), and a resistor (e.g., Rpkg1) corresponding to the fifth and sixth power planes VDDPL3 and GNDPL3 described above with reference to FIGS. 4 and 5. The second route R2 for transmitting the voltage to the second core 112 may be understood as an equivalent circuit including at least one of an inductor (e.g., Lpkg2), a capacitor (e.g., CPkg2), and a resistor (e.g., Rpkg2) corresponding to the seventh and eighth power planes VDDPL4 and GNDPL4 described above with reference to FIGS. 3 and 4.

The processor chip 110 may include the first core 111 and the second core 112. In some example embodiments, the first core 111 and a power line connected to the first core 111 may be understood as an equivalent circuit including at least one of a resistor Rcore1 and a capacitor Ccore1, and a first current source 115. The second core 112 and a power line connected to the second core 112 may be understood as an equivalent circuit including at least one of a resistor Rcore2 and a capacitor Ccore2, and a second current source 116. The first current source 115 and the second current source 116 may refer to active elements included in the first core 111 and the second core 112. The power delivery network 60 according to some example embodiments may include a power connection line 114 between the first core 111 and the second core 112. In detail, the power connection line 114 for connecting a first power line (e.g., first power grid, not shown) connected to the first core 111 to a second power line (e.g., second power grid, not shown) connected to the second core 112 may be modeled as a resistor.

An impedance from the processor chip 110 toward the package substrate 120 may be power delivery network impedance Zpdn. The first core 111 and the second core 112 may be connected to the power delivery network impedance Zpdn. As the power delivery network impedance Zpdn decreases, a noise while the first core 111 and the second core 112 are active may be reduced. Thus, the power delivery network 60 may be designed on the basis of the power delivery network impedance Zpdn. The processor chip 110 according to some example embodiments may adjust the power delivery network impedance Zpdn by including the power connection line 114.

Figure 6:
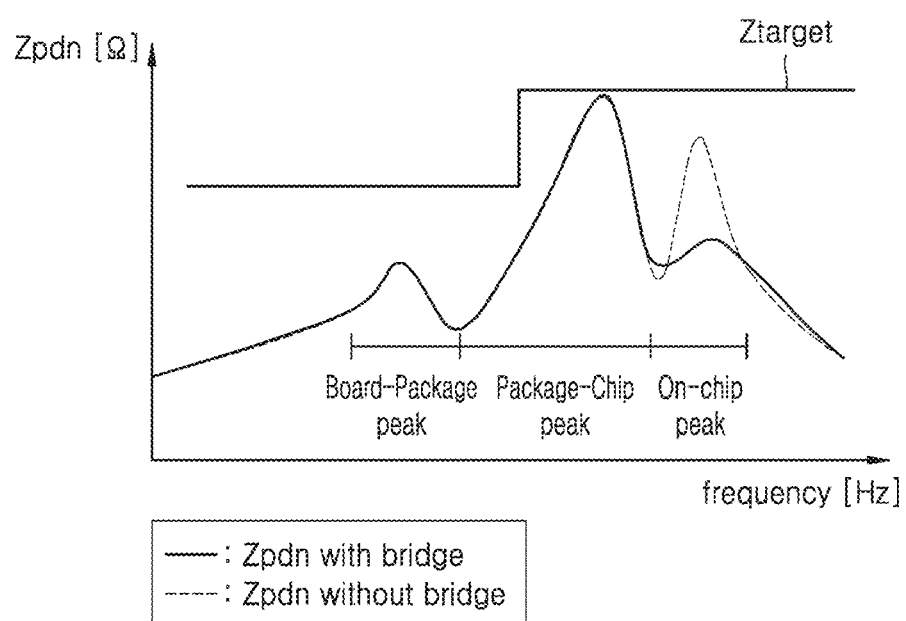
FIG. 6 is a graph illustrating power delivery network impedance of a semiconductor system including a power connection line according to some example embodiments.

FIG. 6 is a graph illustrating power delivery network impedance of a semiconductor system including a power connection line according to some example embodiments. Referring to FIG. 6, a power delivery network impedance Zpdn may be set lower than a target impedance Ztarget to provide a stable voltage to the processor chip 110. The power delivery network impedance Zpdn may vary in size according to a frequency. The power delivery network impedance Zpdn may be determined by a capacitor, an inductor, and a resistor of the power delivery network 60. In a low frequency domain, a peak of the power delivery network impedance Zpdn may be determined by inductors, capacitors, and resistors located in the board 130 and the package substrate 120. In an intermediate frequency domain, the peak of the power delivery network impedance Zpdn may be determined by inductors, capacitors, and resistors located in the package substrate 120 and the processor chip 110. In a high frequency domain, the peak of the power delivery network impedance Zpdn may be determined by the capacitor in the processor chip 110. Because impedance is inversely proportional to capacitance, as capacitance of the processor chip 110 increases, the power delivery network impedance Zpdn may decrease.

When power lines of a plurality of cores are connected to each other by the power connection line 114, the capacitance of the processor chip 110 may increase. Herein, the power connection line 114 may be referred to as a bridge. As illustrated in FIG. 6, in a case of a power delivery network including the power connection line 114, the power delivery network impedance Zpdn may be lowered in a high frequency domain. In other words, according to some example embodiments, the power delivery network impedance Zpdn may be lowered by the power connection line 114 included in the processor chip 110, and thus, power integrity may be improved.

Figure 7:
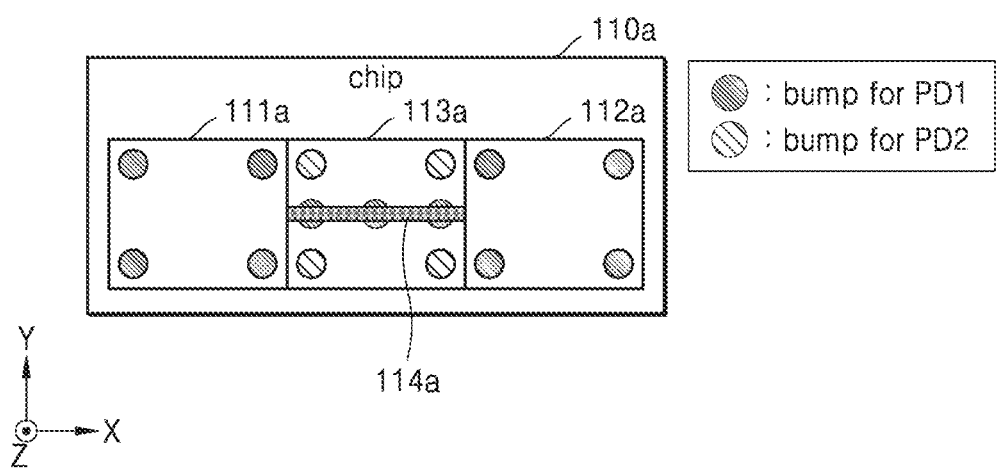
FIG. 7 is a view illustrating an arrangement of bumps according to some example embodiments.

FIG. 7 is a view illustrating an arrangement of bumps according to some example embodiments. Referring to FIG. 7, a processor chip 110a may include a plurality of semiconductor regions including, for example, a first region 111a through a third region 113a in which IP blocks are formed. In detail, the processor chip 110a may include the first region 111a in which a first core is formed, the second region 112a in which a second core is formed, and the third region 113a in which a cache is formed. IP blocks arranged in the first region 111a and the second region 112a may form a first power domain PD1, and IP blocks arranged in the third region 113a may form a second power domain PD2.

A plurality of bumps may be arranged in a −Z direction of the processor chip 110a. In detail, first bumps used for transmitting a voltage to the first power domain PD1 (e.g., first bumps configured to provide the first and second power lines of the first and second core regions with the first voltage transmitted from an exterior of the processor chip 110a), and second bumps used for transmitting a voltage to the second power domain PD2 (e.g., second bumps configured to provide the third power line of the cache region with the second voltage transmitted from an exterior of the processor chip 110a may be arranged in the −Z direction of the processor chip 110a. The first bumps may be arranged in the −Z direction of the first region 111a and the second region 112a, and the second bumps may be arranged in the −Z direction of the third region 113a. In the processor chip 110a according to some example embodiments, the first bumps used for transmitting the voltage to the first power domain PD1 may be arranged in the −Z direction of the third region 113a. In detail, the first bumps may be electrically connected to the power connection line 114 passing through the third region 113a in which the cache is arranged. In other words, the first bumps may be located not only in the first region 111a in which the first core is arranged and the second region 112a in which the second core is arranged, but also at least one first bump may be located in the third region 113a in which the cache is arranged (e.g., within a boundary of the cache region) and may be configured to provide the first and second power lines with the first voltage transmitted from an exterior of the processor chip 110a (e.g., via the power connection line 114a), thereby improving the degree of freedom in the design of bumps for transmitting power to a first power domain.

Figure 8:
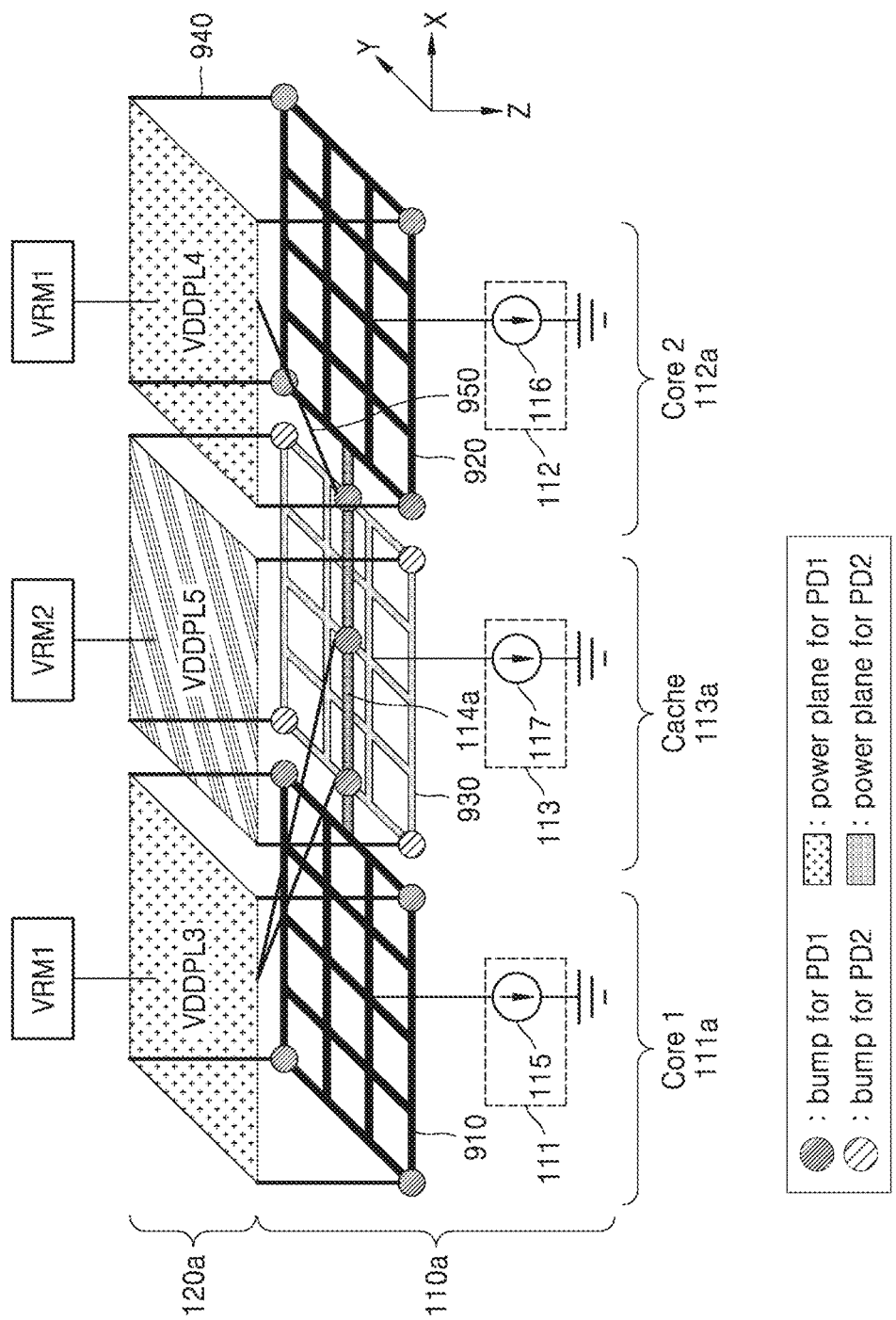
FIG. 8 is a view illustrating a power connection line and bumps according to some example embodiments.

FIG. 8 is a view illustrating a power connection line and bumps according to some example embodiments. In detail, FIG. 8 is a view illustrating in detail an arrangement of the power connection line and the bumps of FIG. 7. Referring to FIG. 8, a processor chip 110a may include a first region 111a in which a first core 111 is arranged, a second region 112a in which a second core 112 is arranged, and a third region 113a in which a cache 113 is arranged and between the first and second regions 111a and 112a. The first region 111a in which the first core 111 is arranged may be referred to herein interchangeably as a first core region and/or first semiconductor region and may include, in addition to the first core 111, a first power line 910 configured to provide a first voltage to the first core 111. The second region 112a in which the second core 112 is arranged may be referred to herein interchangeably as a second core region and/or second semiconductor region and may include, in addition to the second core 112, a second power line 920 configured to provide the first voltage to the second core 112. The third region 113a in which the cache is arranged may be referred to herein interchangeably as a cache region and/or third semiconductor region and may include, in addition to the cache 113, a third power line 930 configured to provide a second voltage (e.g., same or different from the first voltage) to the cache 113. A first current source 115 may refer to an active element of the first core 111, a second current source 116 may refer to an active element of the second core 112, and a third current source 117 may refer to an active element of the cache 113. For convenience of description, the first core 111, the second core 112, and the cache 113 are modeled as current sources, but it will be understood by one of ordinary skill in the art that the first core 111, the second core 112, and the cache 113 may be represented by an equivalent circuit including at least one of a resistor, an inductor, and a capacitor. A package substrate 120a may include a fifth power plane VDDPL3, a seventh power plane VDDPL4, and a ninth power plane VDDPL5, which may be referred to herein as respective first, second, and third power planes configured to transmit power to respective first, second and third regions 111a, 112a, and 113a.

The first power line 910, which may be a first power grid, may be connected to first bumps and may be provided with a voltage from the fifth power plane VDDPL3 through the first bumps. The first bumps may be connected to the fifth power plane VDDPL3 through a via 940. The via 940 may extend vertically in the Z-axis direction. The fifth power plane VDDPL3 may provide the first power line 910 with a first operating voltage generated by a first voltage regulator module VRM1. The first core may be provided with an operating voltage from the first power line 910. The second power line 920, which may be a second power grid, may be connected to the first bumps and may be provided with a voltage from the seventh power plane VDDPL4 through the first bumps. The fifth and seventh power planes VDDPL3 and VDDPL4 may collectively be included in a first power plane configured to transmit the first operating voltage to the first and second power lines 910 and 920). The seventh power plane VDDPL4 may provide the second power line 920 with the first operating voltage generated by the first voltage regulator module VRM1. The second core may be provided with an operating voltage from the second power line 920. The third power line 930, which may be a third power grid, may be connected to second bumps and may be provided with a voltage from the ninth power plane VDDPL5 (e.g., second power plane) through the second bumps, such that the ninth power plane VDDPL5 may be included in a second power plane configured to transmit power to the third region 113a. The ninth power plane VDDPL5 may provide the third power line 930 with a second operating voltage generated by a second voltage regulator module VRM2. The cache may be provided with an operating voltage from the third power line 930. For convenience of description, a power line is illustrated as having a grid shape but is not limited thereto, and may have the grid shape, a mesh shape, a stripe shape, a rail shape, or the like. Also, for convenience of description, bumps are illustrated as being arranged at corners of a power line having a grid shape, but the locations of the bumps may vary according to the complexity of the design or the like. As referred to herein a power line may be referred to as a power grid, particularly when the power line has a grid shape (e.g., a first power line having a grid shape may be a first power grid, a second power line having a grid shape may be a second power grid, etc.)

Referring to FIG. 8, the first power line 910 and the second power line 920 may be connected (e.g., electrically connected) to each other through a power connection line 114*a* that is at least partially in the third region 113*a*. The power connection line 114*a* may pass through the third region 113*a* in which the cache 113 is arranged (e.g., located). The processor chip 110*a* according to some example embodiments may include a power connection line for connecting power lines connected to a plurality of cores that are spaced apart from each other, thereby reducing on-chip capacitance and improving power integrity.

The power connection line 114*a* may be connected to the first bumps for transmitting the first operating voltage to the first power domain PD1. The first bumps connected to the power connection line 114*a* may be connected to at least one of the fifth power plane VDDPL3 (e.g., a first power plane of the package substrate 120*b*) and the seventh power plane VDDPL4 (e.g., a second power plane of the package substrate 120*b*). Vias 950 connected to first bumps arranged on the power connection line 114*a* may be connected to the fifth power plane VDDPL3 or the seventh power plane VDDPL4 to be provided with the first operating voltage. The vias 950 connected to the first bumps arranged on the power connection line 114*a* may not extend in a vertical direction. This is because when the vias 950 extend in the vertical direction as illustrated in FIG. 8, the vias 950 are connected to the ninth power plane VDDPL5 for providing the second operating voltage. Therefore, the vias 950 connected to the first bumps on the power connection line 114*a* may become longer than vias connected to first bumps on the first power line 910 and the second power line 920.

Figure 9:
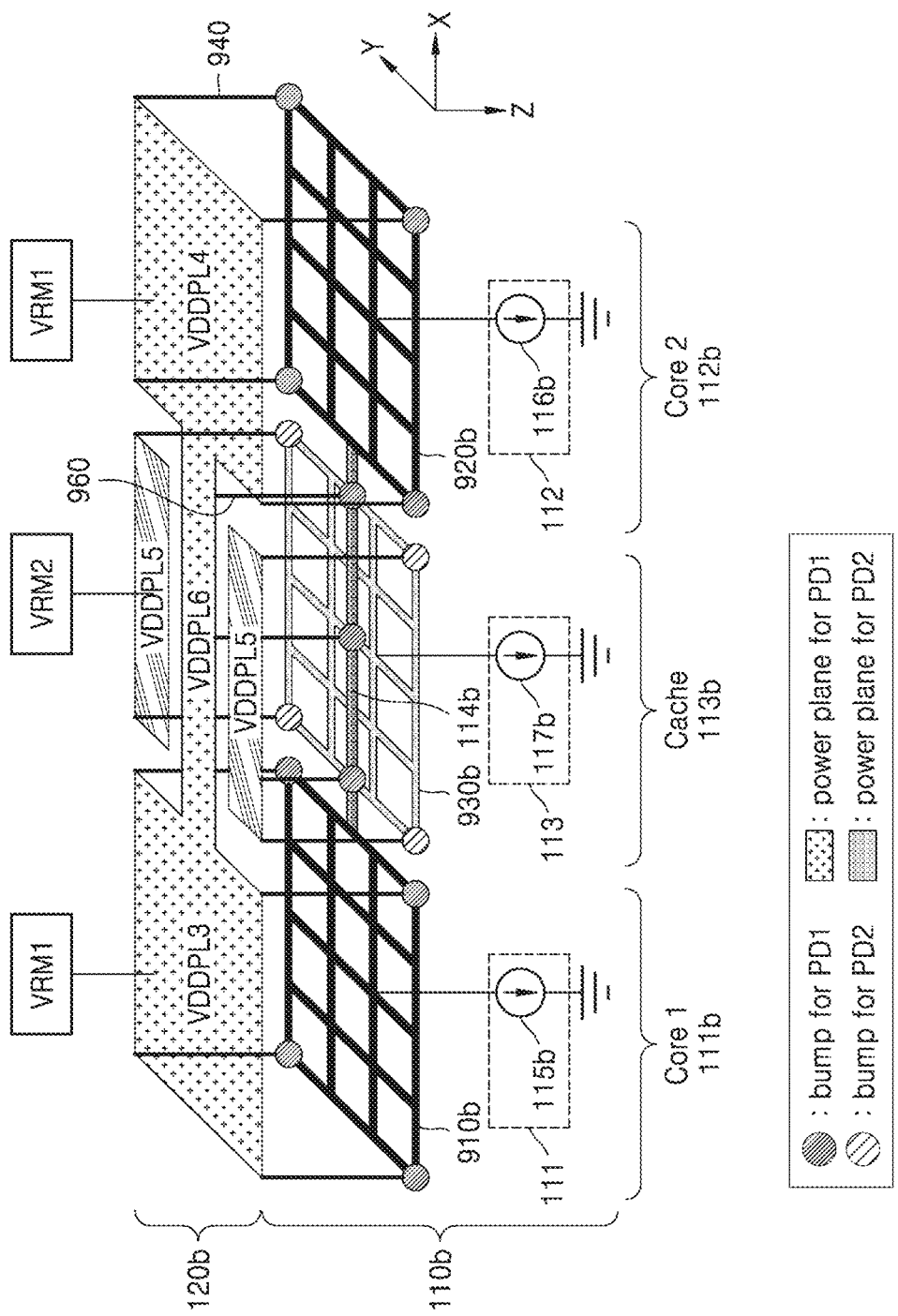
FIG. 9 is a view illustrating connection between a bump and a power plane according to some example embodiments.

FIG. 9 is a view illustrating connection between a bump and a power plane according to some example embodiments. Referring to FIG. 9, a package substrate 120*b* may include an eleventh power plane VDDPL6 in addition to fifth power plane VDDPL3 and seventh power plane VDDPL4. The semiconductor chip 110*b* may include first through third regions 111*b*, 112*b*, and 113*b*. The eleventh power plane VDDPL6, which may be included in the first power plane (e.g., which may overlap the first region 111*b* and second region 112*b*), may overlap a third region 113*b* in which a cache is arranged such that at least a portion of the first power plane overlaps the third region 113*a* in a vertical direction (e.g., Z-axis direction). The eleventh power plane VDDPL6 may be connected to a fifth power plane VDDPL3 or a seventh power plane VDDPL4. In other words, the eleventh power plane VDDPL6 may be provided with a first operating voltage from a first voltage regulator module VRM1. The eleventh power plane VDDPL6 may overlap a power connection line 114*b*. Therefore, unlike the illustration in FIG. 8, vias 960 arranged on the power connection line 114*b* may extend in a vertical direction at a location overlapping the third region 113*a* in a vertical direction (e.g., Z-axis direction) and connect to a first bump on the power connection line 114*b* such that said first bump is configured to transmit power from the first power plane to at least the first power line 910*b* (e.g., first power grid), and potentially also to the second power line 920*b* (e.g., second power grid) where said first bump overlaps the third region 113*b*, which may include the third power line 930*b* (e.g., third power grid) in the vertical direction (e.g., Z-axis direction).

The package substrate 120*b* according to some example embodiments may include the eleventh power plane VDDPL6 in the vertical direction of the power connection line 114*b*, thereby reducing lengths of the vias 960 arranged on the power connection line 114*b*. Also, on-package capacitance may be increased by increasing an area of a power plane for providing the first operating voltage to a first power domain. Accordingly, in an intermediate frequency domain, the power delivery network impedance Zpdn may decrease, and power integrity may be improved.

Figure 10:
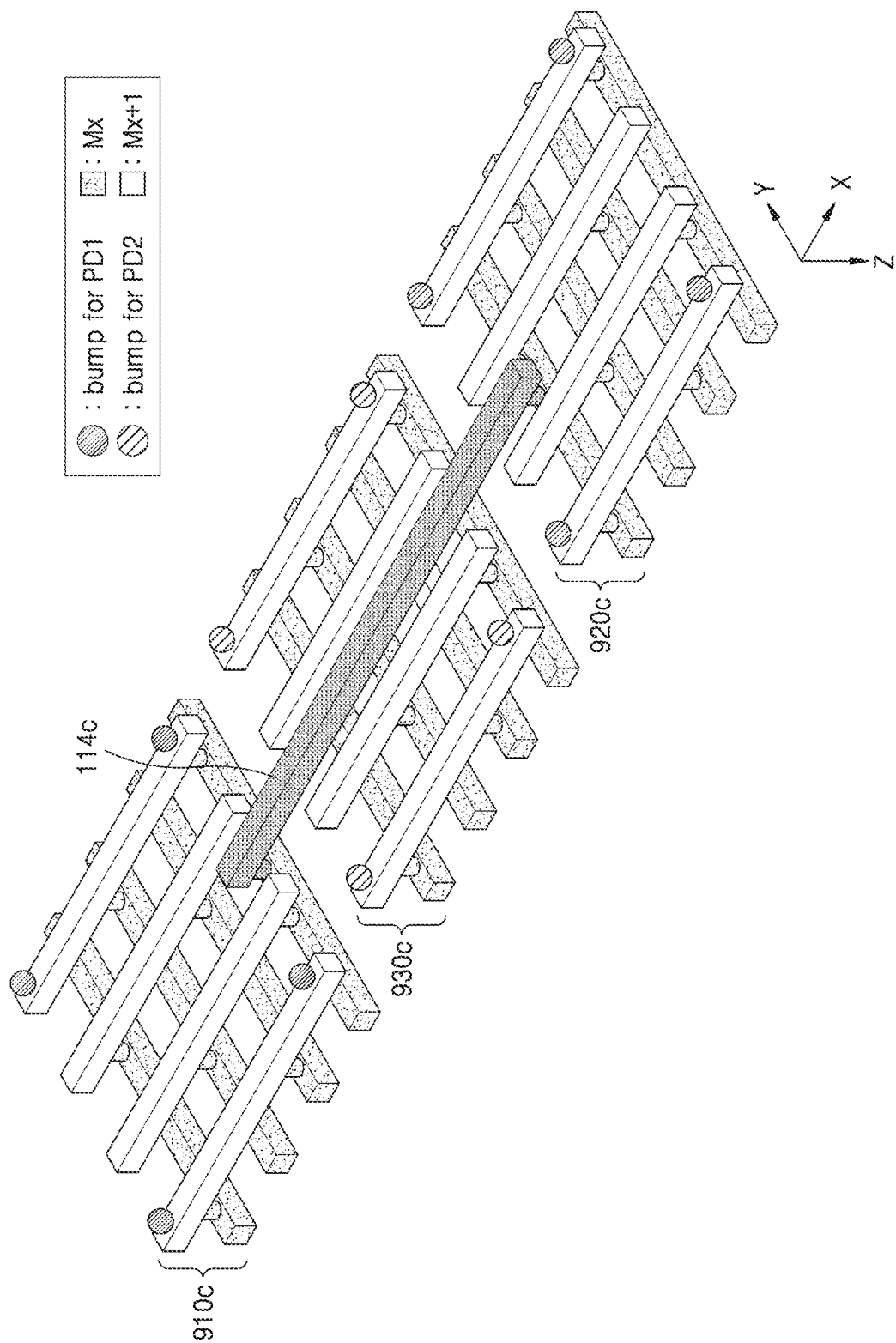
FIGS. 10 and 11 are views illustrating a power line and a power connection line according to some example embodiments.
Figure 11:
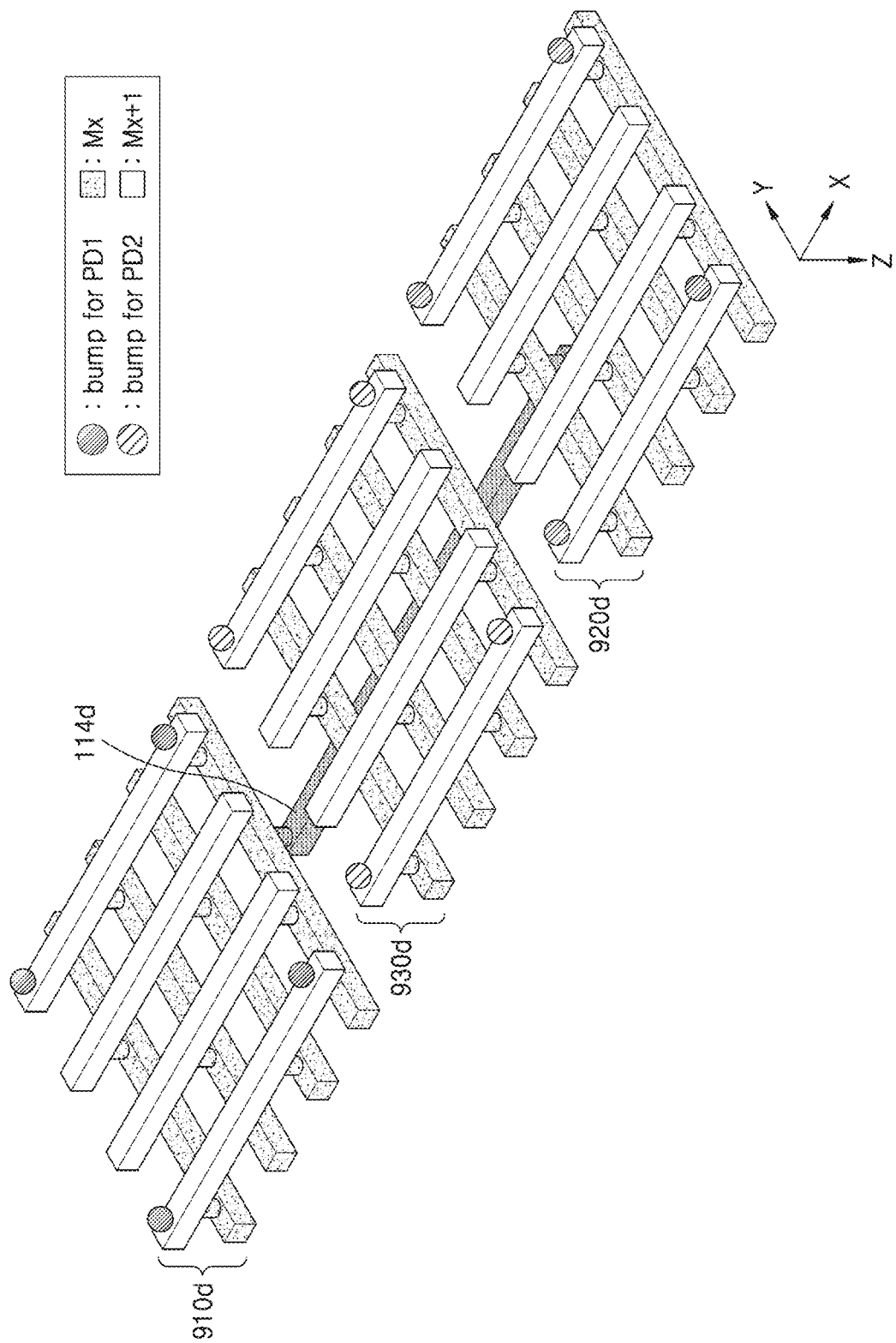

FIGS. 10 and 11 are views illustrating a power line and a power connection line according to some example embodiments. FIGS. 10 and 11 may be views illustrating in detail a plurality of power lines including, for example, the first power line 910, the second power line 920, and the third power line 930 and the power connection line 114*a* described above with reference to FIG. 8. Referring to FIG. 10, first, second, and third power lines 910*c*, 920*c*, and 930*c* may have grid shapes. In detail, first direction power lines extending in the Y-axis direction may be arranged on a line layer Mx, and second direction power lines extending in the X-axis direction may be arranged on a line layer Mx+1. The first direction power lines may be connected to the second direction power lines.

The first power line 910*c* may provide a first operating voltage to a first core, the second power line 920*c* may provide the first operating voltage to a second core, and the third power line 930*c* may provide a second operating voltage to a cache. A power connection line 114*c* may connect the first power line 910*c* to the second power line 920*c*. The power connection line 114*c* may extend in the X-axis direction to connect the first and second power lines 910*c* and 920*c* that are spaced apart from each other in the X-axis direction. The power connection line 114*c* may be formed on the line layer Mx+1. As shown in FIG. 10 and also shown in FIG. 11, the first, second, and third regions 111*a*, 112*a*, 113*a* may include a plurality of line layers (e.g., Mx and Mx+1) that are stacked. The power connection line 114*c* may be on (e.g., directly on, within, etc.) a same line layer as a line layer that the first power line 910*c* and the second power line 920*c* are on (e.g., directly on, within, etc.). The power connection line 114*c* may be on (e.g., directly on, within, etc.) a first line layer, of a plurality of line layers (Mx and Mx+1) that are stacked in the third region 113*a*, that is different from a separate line layer that the third power line 930*c* is on (e.g., directly on, within, etc.). The power connection line 114*c* may extend parallel to the second direction power lines of the third power line 930*c* and not connected to the third power line 930*c*. For convenience of description, one power connection line is illustrated, but the number of power connection lines is not limited thereto.

Referring to FIG. 11, which includes first through third power lines 910*d*, 920*d*, and 930*d*, a power connection line 114*d* may be arranged under a line layer Mx. For example, the power connection line 114*d* may be arranged on a line layer Mx−1. In FIG. 11, the −Z-axis direction may be an up direction, and +Z-axis direction may be a down direction. When the grid shape of the third power line 930*d* is densely formed, a space in which the power connection line 114*d* is to be arranged on the line layer Mx may be insufficient. Therefore, a power connection line according to some example embodiments may be arranged on a line layer different from a line layer on which a power line for providing an operating voltage to a cache is arranged, thereby resolving space restrictions. As in FIG. 10, for convenience of description, one power connection line is illustrated, but the number of power connection lines is not limited thereto.

Figure 12:
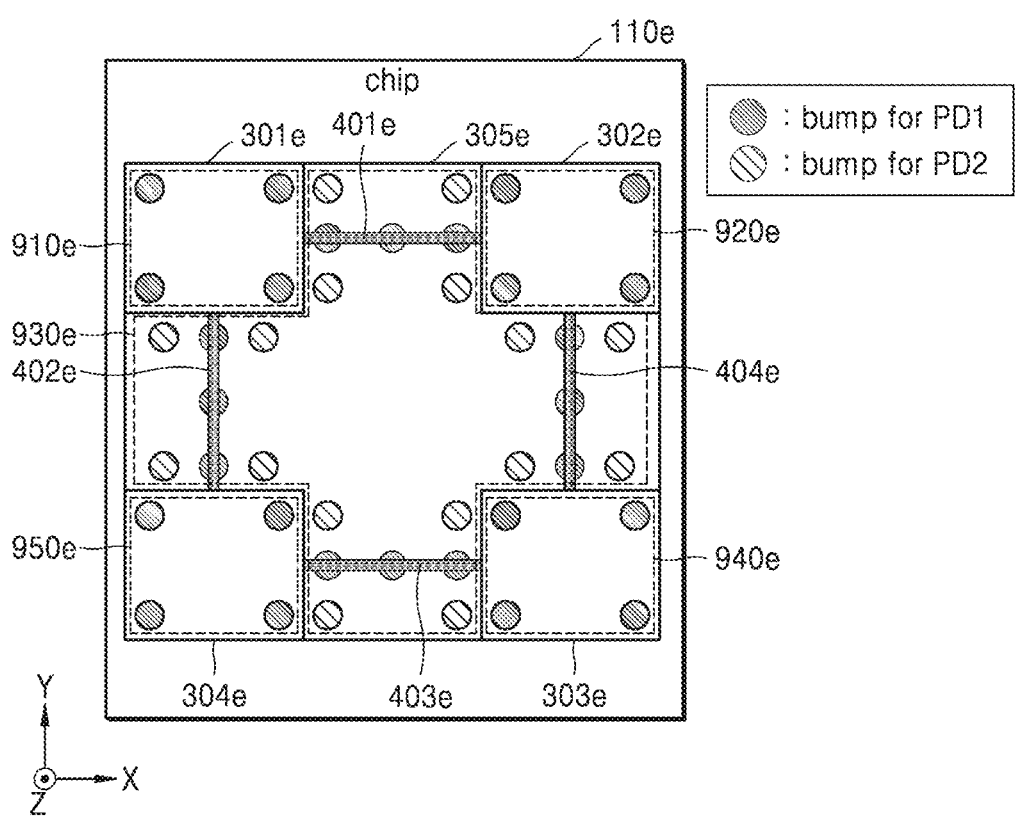
FIG. 12 is a view illustrating an arrangement of bumps according to some example embodiments.

FIG. 12 is a view illustrating an arrangement of a bump according to some example embodiments. Referring to FIG. 12, a processor chip 110*e* may include regions 301*e* through 304*e* in which a plurality of cores are arranged and a region 305*e* in which a cache is arranged. IP blocks located in the regions 301*e* through 304*e* in which the plurality of cores are arranged may form a first power domain, and IP blocks located in the region 305e in which the cache is arranged may form a second power domain. The regions 301e through 304e in which the plurality of cores are arranged may be spaced apart from one another so that the region 305 in which the cache is arranged is among the regions 301e through 304e. The processor chip 100e may include a plurality of power connection lines including, for example, first through fourth power connection lines 401e through 404e for connecting power lines included in the plurality of cores that are spaced apart from one another. Accordingly, as shown in FIG. 12, the processor chip 110e may include at least first, second, third, and fourth core regions (e.g., 301e, 302e, 303e, and 304e, respectively) having respective first, second, fourth, and fifth power lines (e.g., 910e, 920e, 940e, and 950e, respectively) and a cache region (e.g., 305e) having a third power line (e.g., 930e), where the first core region (301e), cache region (305e), and second core region (302e) are aligned in a first direction (e.g., the X-axis direction), the third and fourth core regions (e.g., 303e and 304e) includes respective fourth and fifth power lines (e.g., 940e and 950e) configured to provide the first voltage also provided by at least the first and second power lines (e.g., 910e and 920e), where the third and fourth core regions (e.g., 303e and 304e) are each spaced apart (e.g., offset) from at least the first core region (301e) in a second direction orthogonal to the first direction (e.g., the Y-axis direction), and the cache region (e.g., 305e is between the first and third core regions (e.g., 301e and 303e), between the first and fourth core regions (e.g., 301e and 304e), between the second and third core regions (e.g., 302e and 303e), and between the second and fourth core regions (e.g., 302e and 304e).

The first power connection line 401e, which, as shown in FIG. 12, may extend in the first direction (e.g., X-axis direction) may connect (e.g., electrically connect) a power line included in the region 301e in which a first core is arranged (e.g., first power line 910e) and a power line included in the region 302e in which a second core is arranged (e.g., second power line 920e). The second power connection line 402e may extend in the second direction (e.g., Y-axis direction) and may connect the power line included in the region 302e in which the second core is arranged (e.g., second power line 920e) and a power line included in the region 303e in which a third core is arranged (e.g., fourth power line 940e). The third power connection line 403e extend in the first direction (e.g., X-axis direction) and may connect the power line included in the region 303e in which the third core is arranged (e.g., fourth power line 940e) and a power line included in the region 304e in which a fourth core is arranged (e.g., fifth power line 950e). The fourth power connection line 404e may extend in the second direction (e.g., Y-axis direction) and may connect the power line included in the region 301e in which the first core is arranged (e.g., first power line 910e) and the power line included in the region 304e in which the fourth core is arranged (e.g., fifth power line 950e). The plurality of power connection lines including, for example, the first through fourth power connection lines 401e through 404e may pass through the region 305e in which the cache is arranged.

The processor chip 110e may be provided with a voltage from the outside through a plurality of bumps. As illustrated in FIG. 12, the plurality of bumps may be arranged in the −Z-axis direction of the processor chip 110e. The plurality of bumps may include a first bump for providing a voltage to the first power domain and a second bump for providing a voltage to the second power domain. The first bump may be formed in the regions 301e through 304e in the processor chip 110e in which the plurality of cores are arranged, and the second bump may be formed in the region 305e in the processor chip 110e in which the cache is arranged.

The processor chip 110e according to some example embodiments may include the first bump formed in the region 305e in which the cache is arranged. In detail, the first bump may overlap the plurality of power connection lines including, for example, the first through fourth power connection lines 401e through 404e. In other words, when a via extends from the first bump in the +Z-axis direction, the first bump may be connected to a power connection line.

Figure 13:
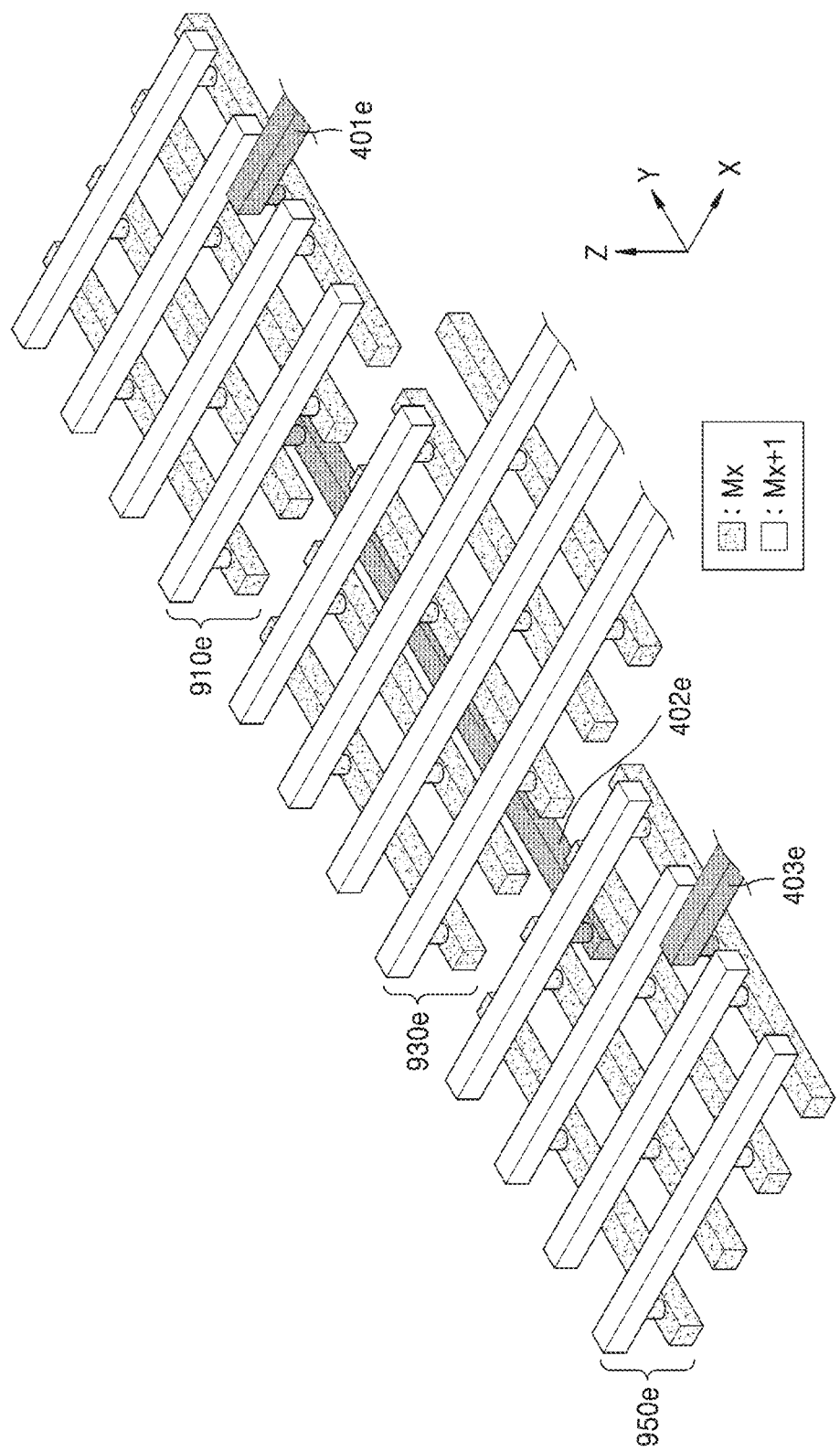
FIG. 13 is a view illustrating a power line and a power connection line according to some example embodiments.

FIG. 13 is a view illustrating a power line and a power connection line according to some example embodiments. In detail, FIG. 13 is a view illustrating power lines respectively included in the region 301e in which the first core is arranged, the region 304e in which the fourth core is arranged, and the region 305e in which the cache is arranged, described above with reference to FIG. 12. The region 301e in which the first core is arranged may include a first power line 910e, the region 304e in which the fourth core is arranged may include a second power line 920e, and the region 305e in which the cache is arranged may include a third power line 930e.

Referring to FIG. 13, the first, second, and third power lines 910e, 920e, and 930e may have grid shapes. In detail, first direction power lines extending in the Y-axis direction may be arranged on a line layer Mx, and second direction power lines extending in the X-axis direction may be arranged on a line layer Mx+1. The first direction power lines may be connected to the second direction power lines.

The first power line 910e may provide a first operating voltage to the first core, the fifth power line 950e may provide the first operating voltage to the fourth core, and the third power line 930e may provide a second operating voltage to the cache. The second power connection line 402e may connect the first power line 910e to the fifth power line 950e. The second power connection line 402e may extend in the Y-axis direction to connect the first and fifth power lines 910e and 950e that are spaced apart from each other in the Y-axis direction. The second power connection line 402e may be formed on the line layer Mx. The second power connection line 402e may extend parallel to the first direction power lines of the third power line 930e and not connected to the third power line 930e. For convenience of description, one power connection line is illustrated, but the number of power connection lines is not limited thereto. As shown in at least FIG. 13, the first power line 910e may include a first direction power line extending in a first direction (e.g., X-axis direction) and connected to the second power connection line 402e, and a second direction power line extending in an orthogonal second direction (e.g., Y-axis direction) and connected to the first power connection line 401e.

Referring to FIG. 12 and FIG. 13, when the region 301e in which the first core is arranged and the region 302e in which the fourth core is arranged are spaced apart from each other in the Y-axis direction, a second power connection line 402e may extend in the Y-axis direction to connect the first power line 910e to the fifth power line 950e. Although only some are illustrated for convenience of description, the first power connection line 401e and the third power connection line 403e may extend in the X-axis direction to connect power lines that are spaced apart from each other in the X-axis direction. For example, where the fourth core region (e.g., 304e) includes a plurality of line layers (e.g., Mx and Mx+1) that are stacked, the second power connection line 402e may be on (e.g., directly on, within, etc.) a line layer that is different from a separate line layer that the first power connection line 401e is on (e.g., directly on, within, etc.).

While the inventive concepts have been particularly shown and described with reference to example embodiments thereof, it will be understood that various changes in form and details may be made therein without departing from the spirit and scope of the following claims.

What is claimed is:

1. A semiconductor chip, comprising:
a first core region including a first core and a first power line configured to provide a first voltage to the first core;
a second core region including a second core and a second power line configured to provide the first voltage to the second core;
a cache region between the first core region and the second core region, the cache region including a cache and a third power line configured to provide a second voltage to the cache; and
a first power connection line in the cache region, the first power connection line connecting the first power line to the second power line.

2. The semiconductor chip of claim 1, wherein
the cache region includes a plurality of line layers that are stacked, and
the first power connection line is on a first line layer that is different from a separate line layer on which the third power line is located.

3. The semiconductor chip of claim 1, wherein
the first core region, the second core region, and the cache region include a plurality of line layers that are stacked, and
the first power connection line is on a same line layer as a line layer on which the first power line and the second power line are located.

4. The semiconductor chip of claim 1, wherein
the first core region, the cache region, and the second core region are aligned in a first direction,
the semiconductor chip further includes a third core region including a fourth power line configured to provide the first voltage, and spaced apart from the first core region in a second direction orthogonal to the first direction, and
the cache region is between the first core region and the third core region.

5. The semiconductor chip of claim 4, wherein the first power connection line extends in the first direction.

6. The semiconductor chip of claim 4, further comprising:
a second power connection line arranged to extend in the second direction in the cache region so that the first power line and the fourth power line are connected to each other.

7. The semiconductor chip of claim 6, wherein
the third core region includes a plurality of line layers that are stacked, and
the second power connection line is arranged on a first line layer that is different from a separate line layer on which the first power connection line is located.

8. The semiconductor chip of claim 6, wherein the first power line comprises:
a first direction power line extending in the first direction and connected to the first power connection line; and
a second direction power line extending in the second direction and connected to the second power connection line.

9. The semiconductor chip of claim 1, further comprising:
a first bump configured to provide the first power line and the second power line with the first voltage transmitted from an exterior of the semiconductor chip; and
a second bump configured to provide the third power line with the second voltage transmitted from the exterior of the semiconductor chip,
wherein the first bump is within a boundary of the cache region.

10. A semiconductor device, comprising:
a semiconductor chip including a first semiconductor region including a first power grid configured to be provided with a first voltage and a second semiconductor region including a second power grid configured to be provided with the first voltage; and
a package substrate including a first power plane configured to transmit the first voltage to the first power grid and the second power grid and connected to the semiconductor chip in a vertical direction,
wherein the semiconductor chip includes a power connection line between the first semiconductor region and the second semiconductor region and connecting the first power grid to the second power grid, such that the first power grid, the second power grid, and the power connection line are each inside the semiconductor chip.

11. The semiconductor device of claim 10, wherein
the semiconductor chip includes a third semiconductor region between the first semiconductor region and the second semiconductor region,
the power connection line passes through the third semiconductor region, and
the package substrate includes a second power plane configured to transmit power to the third semiconductor region.

12. The semiconductor device of claim 11, wherein the first power plane is arranged so that at least a portion thereof overlaps the third semiconductor region in the vertical direction.

13. The semiconductor device of claim 12, wherein
the semiconductor chip further includes a first bump configured to transmit power from the first power plane to the first power grid, and
the first bump overlaps the third semiconductor region in the vertical direction.

14. The semiconductor device of claim 13, wherein
the first power plane is connected to the first bump through a via extending in the vertical direction, and
the via extends in the vertical direction at a location overlapping the third semiconductor region.

15. The semiconductor device of claim 11, wherein
each of the first semiconductor region and the second semiconductor region includes a particular region in which a separate core is located, and
the third semiconductor region includes a separate region in which a cache is located.

16. A semiconductor system, comprising:
a semiconductor chip including
a first semiconductor region including a first power line, and
a second semiconductor region including a second power line;
a package substrate including a first power plane configured to transmit a first operating voltage to the first power line and the second power line; and
a power management integrated circuit including a first voltage regulator module that is configured to generate the first operating voltage from an external power source and configured to transmit the first operating voltage to the first power plane, wherein the semiconductor chip includes a first power connection line between the first semiconductor region and the second semiconductor region and connecting the first power line to the second power line, such that the first power line, the second power line, and the first power connection line are each inside the semiconductor chip.

17. The semiconductor system of claim 16, wherein the semiconductor chip includes a third semiconductor region between the first semiconductor region and the second semiconductor region, the first power connection line passes through the third semiconductor region, and the package substrate includes a second power plane configured to transmit a second operating voltage to the third semiconductor region.

18. The semiconductor system of claim 17, wherein the power management integrated circuit includes a second voltage regulator module that is configured to generate the second operating voltage from the external power source and transmit the second operating voltage to the second power plane.

19. The semiconductor system of claim 18, further comprising:

a board configured to transmit, to the package substrate, an operating voltage generated from the power management integrated circuit, wherein the board includes a third power plane configured to transmit, to the first power plane, the first operating voltage generated by the first voltage regulator module, and a fourth power plane configured to transmit, to the second power plane, the second operating voltage generated by the second voltage regulator module.

20. The semiconductor system of claim 16, wherein the semiconductor chip includes a third semiconductor region between the first semiconductor region and the second semiconductor region, each of the first semiconductor region and the second semiconductor region includes a particular region in which a separate core is located, and the third semiconductor region includes a separate region in which a cache is located.

\* \* \* \* \*